(12) United States Patent
Undheim

(10) Patent No.: US 12,088,306 B2
(45) Date of Patent: Sep. 10, 2024

(54) CLOCK DOMAIN CROSSING

(71) Applicant: Nordic Semiconductor ASA, Trondheim (NO)

(72) Inventor: Ruben Undheim, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 18/025,155

(22) PCT Filed: Sep. 8, 2021

(86) PCT No.: PCT/EP2021/074719
§ 371 (c)(1),
(2) Date: Mar. 7, 2023

(87) PCT Pub. No.: WO2022/053521
PCT Pub. Date: Mar. 17, 2022

(65) Prior Publication Data
US 2023/0327657 A1    Oct. 12, 2023

(30) Foreign Application Priority Data
Sep. 8, 2020  (GB) .................................... 2014083

(51) Int. Cl.
*H03K 5/26*      (2006.01)
*H03K 3/037*     (2006.01)
(Continued)

(52) U.S. Cl.
CPC .............. *H03K 5/26* (2013.01); *H03K 3/037* (2013.01); *H03L 7/08* (2013.01); *H03K 2005/00058* (2013.01)

(58) Field of Classification Search
CPC ........................................................ H03K 5/26
See application file for complete search history.

(56) References Cited

U.S. PATENT DOCUMENTS 7,564,283 B1   7/2009  Logue et al.
7,940,667 B1   5/2011  Coady et al.
(Continued)

FOREIGN PATENT DOCUMENTS

EP         0712204 A2     5/1996
WO    WO 99/19806 A1     4/1999

OTHER PUBLICATIONS

International Search Report and Written Opinion for PCT/EP2021/074719, mailed Jan. 5, 2022, 13 pages.
(Continued)

*Primary Examiner* — Patrick O Neill
(74) *Attorney, Agent, or Firm* — Klarquist Sparkman, LLP

(57) ABSTRACT

An electronic device comprises a synchronisation system that receives a signal clocked by a first clock signal having a first frequency and receives a second clock signal having said first frequency, but offset in phase from the first clock signal. The signal is delayed by an adjustable delay period. It is determined whether, following a logic transition in the delayed signal, the next clock edge received is an active edge or is a non-active edge. A calibration controller increases the delay period when the next clock edge is a non-active edge and maintains or decreases the delay period when the next clock edge is an active edge, or decreases the delay period when the next clock edge is an active edge and maintains or increases the delay period when the next clock edge is a non-active edge.

20 Claims, 6 Drawing Sheets

(51) Int. Cl.
 *H03L 7/08* (2006.01)
 *H03K 5/00* (2006.01)

(56) References Cited

U.S. PATENT DOCUMENTS

| | | |
|---|---|---|
| 10,095,263 B1 | 10/2018 | Wu et al. |
| 2009/0307521 A1 | 12/2009 | Lee et al. |
| 2015/0139373 A1* | 5/2015 | Hjerto ................ G06F 5/06 375/354 |
| 2019/0101590 A1* | 4/2019 | Sarda ............ G01R 31/318558 |

OTHER PUBLICATIONS

IPO Search Report under Section 17(5) for Great Britain Application No. 2014083.6, mailed Feb. 12, 2021, 3 pages.

* cited by examiner

CLOCK DOMAIN CROSSING

CROSS REFERENCE TO RELATED APPLICATIONS

This is the U.S. National Stage of International Application No. PCT/EP2021/074719, filed Sep. 8, 2021, which was published in English under PCT Article 21(2), which in turn claims the benefit of Great Britain Application No. 2014083.6, filed Sep. 8, 2020.

BACKGROUND OF THE INVENTION

The present invention relates to a circuit for communicating a signal between clock domains.

Clock signals are used to coordinate the action of electronic circuits, especially integrated circuits. Typically, a periodic signal is generated by a quartz crystal oscillator and is distributed to clocked circuit elements, such as D-type flip-flops, over one or more clock wires in the electronic circuit. A clock domain is an arrangement of one or more circuit elements that are clocked by the same clock signal.

Electronic circuits, such as system on chip (SoC) devices, may comprise multiple clock domains, and it is often desirable to be able to communicate data from one clock domain to another. This is known as Clock Domain Crossing (CDC).

It is typically important in circuits implementing CDC that signals, such as trigger signals and data signals, sent between clock domains are synchronised to the clock of the destination domain before they are used by components within the destination domain. A D-type flip-flop requires its input to be constant for a setup time immediately preceding each clock transition, and for a hold time immediately following each clock transition, or else its output at the next clock transition can be metastable (i.e. at a voltage somewhere between logic high and logic low). If this metastability is allowed to propagate into a destination clock-domain circuit, this can lead to errors and malfunction.

A common approach to minimise the risk of distributing metastable values into the destination circuit is to use a two-flip-flop synchroniser circuit, comprising two D-type flip-flops in series. As explained in more detail below, with reference to FIG. 1, the first flip-flop samples the input signal into the destination clock domain and waits for a full clock cycle, to allow time for any metastability on its output to decay, before its output is sampled by the second flip-flop. The second flip-flop further reduces the risk of any metastability propagating through the synchroniser, and the output of the second flip-flop should then be stable and ready for wider distribution within the destination clock domain.

However, while such synchronisers can effectively prevent metastability spreading within a destination clock domain, they do not guarantee that an incoming logic level passes through the synchroniser without changing value. Therefore, when sending a trigger signal over a clock boundary, in order to trigger an action in the destination domain, it is customary to hold the trigger signal active for more than one cycle of the destination clock (e.g. for two clock cycles). In this way, even if the first cycle active value is lost due to metastability which is resolved incorrectly to an inactive logic level in the synchroniser, the second active cycle should pass through the synchroniser correctly.

A shortcoming of this approach is that it introduces an uncertainty of one destination clock cycle as to the time that the trigger signal is received at the destination domain. Although this one-cycle uncertainty may be acceptable in many scenarios, the Applicant has recognised that it may be undesirable in some time-critical applications, such as radio distance ranging, in which it is important to retain as much timing accuracy as possible even as a signal crosses a clock domain boundary.

If the source and destination clock domains are completely asynchronous (e.g. being driven by two different clock sources at different frequencies), it may not be feasible to avoid this one-cycle uncertainty.

However, in some circuits, a source clock domain and a destination clock domain may be clocked at the same nominal frequency, but with a phase offset between their respective clock signals. Such clock signals will be referred to herein as "quasi-synchronous" clocks. This can occur when the two domains are clocked by respective clock signals derived from the same crystal (but with different propagation delays), or when one domain is clocked by a first clock source (e.g. a crystal) and the other domain is clocked by a second clock source (e.g. a resistor-capacitor oscillator) that is periodically calibrated to the first clock source.

The present invention aims to provide a circuit for synchronising clock domain crossing signals in which timing uncertainty can be reduced or eliminated.

SUMMARY OF THE INVENTION

When viewed from a first aspect, the invention provides an electronic device comprising a synchronisation system, wherein the synchronisation system comprises:

a signal input for receiving a signal clocked by a first clock signal having a first frequency;

a clock input for receiving a second clock signal having said first frequency, but offset in phase from the first clock signal, wherein the second clock signal comprises a repeated sequence of alternating active and non-active clock edges;

a delay block arranged to delay the signal by an adjustable delay period, and to output the signal delayed by said delay period, wherein the delay period is adjustable at a resolution finer than one clock period of the second clock signal; and a calibration system for calibrating the adjustable delay period, wherein the calibration system comprises:

a detection block configured to determine whether, following the output of a logic transition from the delay block, the next clock edge received at the clock input is an active edge or is a non-active edge; and a calibration controller configured to increase the delay period when the next clock edge is a non-active edge and to maintain or decrease the delay period when the next clock edge is an active edge, or configured to decrease the delay period when the next clock edge is an active edge and to maintain or increase the delay period when the next clock edge is a non-active edge.

Thus it will be appreciated that the synchronisation system, once calibrated, will delay received logic transitions so that they are output at, or shortly before or after, respective non-active edges of the second clock signal.

By aligning logic transitions of signals coming from a first (source) clock domain with the non-active (e.g. falling) edges of the second (destination) clock signal, the transitions can be kept away from the setup and hold regions of flip-flops in the second (destination) clock domain, clocked by the second clock signal. This is because the setup and hold regions span the active (e.g. rising) clock edge, while the non-active edge occurs at the point in the clock cycle furthest from the active edge (i.e. mid cycle). The risk of the delayed signal causing metastability in the first flip-flop that receives the signal after it is output by the delay block can thus be minimised or eliminated, thereby ensuring that signals output by the first clock domain can be reliably detected in the second clock domain after a consistent delay, without sometimes being detected one clock cycle later than at other times due to metastability. This can therefore substantially reduce or remove the one cycle uncertainty of a conventional two-flip-flop synchroniser.

Reducing or removing the one cycle uncertainty allows embodiments of the synchronisation circuit to be used advantageously in time-critical applications where it is desirable for the timing of actions to be as consistent as possible. For example, in radio ranging applications, it is desirable to be able to accurately determine a time or phase offset between a transmitted signal and a received signal in order to calculate a distance. If a processor in a first clock domain triggers the transmission of radio signals from a radio in a second clock domain, the ranging accuracy may be improved using embodiments of the present synchronisation system, which enable the trigger signals to be received by the radio after a constant delay every time, rather than having uncertainty of one cycle.

The electronic device may comprise first circuitry, arranged to be clocked by the first (source) clock signal and configured to send the signal to the synchronisation system. The first circuitry may comprise a processor executing software for generating the signal. The device may comprise second circuitry, arranged to be clocked by the second (destination) clock signal, and configured to receive the signal from the synchronisation system. The second circuitry may comprise a radio peripheral or other module configured to perform an action in response to receiving the signal. The electronic device may be, or may comprise, an integrated-circuit chip, such as a system-on-chip (SoC), e.g. a radio-on-a-chip.

The signal may be a trigger signal. It may consist of a single logic transition (e.g. low to high), or a pair of opposite logic transitions (e.g. low to high, followed by high to low). In some embodiments, the signal may be asserted for only one cycle of the first clock signal. This contrasts with conventional synchronisation approaches, in which a trigger signal may need to be asserted for two or more clock cycles in order to reduce the risk of a failed detection due to metastability in the destination domain. However, the synchronisation circuit is not restricted to use with trigger signals and, in some embodiments, the synchronisation circuit may be arranged to synchronise other signals, such as data signals, address signals, interrupt signals, etc.

The first clock signal may be provided by a crystal or a phase-locked loop (PLL) system. The second clock signal may be provided by the same or a different crystal or phase-locked loop (PLL) system. The crystal(s) may be part of the electronic device or may be external. The first clock signal and/or the second clock signal may be square-wave signals. The active edge of the second clock signal may be a rising edge of the second clock signal. The non-active edge of the second clock signal may be a falling edge of the second clock signal. The first frequency may be a nominal frequency of the first clock signal and/or second clock signal. The clock signals may be synchronised in frequency—i.e. locked together so as to have the same frequency, at least when averaged over a period of time. However, they may have independently varying jitter. The second clock signal may be offset from the first clock signal by any non-zero phase offset, which may be unknown. The phase offset may be constant or may drift between clock cycles up to a tolerance—e.g. 1%, 5% or 10%. At times there may be no phase offset between the two clock signals (i.e. the offset may be zero). When the phase offset is constant, it may be possible for the synchronisation circuit to completely eliminate the risk of metastability. Even if there is some drift, the risk of metastability arising may still be low.

The delay period may be selectable from a plurality of predetermined delay periods. It may provide an integer, n, power of two delay periods, e.g. thirty-two different delays, which may include a zero-delay option. This can conveniently allow the delay to be selected by a value received at the delay module over set of n (e.g. five) binary lines.

The delay block may comprise one or more delay elements and a multiplexer. The multiplexer may comprise a plurality of inputs. It may comprise an output that can be selectively coupled to one of the inputs—e.g. by a control signal. One of the inputs to the multiplexer may receive the signal with no delay. One or more (e.g. all but one) of the inputs may be arranged to receive the output from a respective delay element. Each delay element may be arranged to receive the signal and to delay the signal by a respective delay length. The delay elements may provide different respective delays. However, in some embodiments two or more of the delay elements may be arranged in series such that a subsequent delay element receives the (delayed) output of a preceding delay element. Thus, the subsequent delay element may add to a cumulative delay applied to the signal. Each input of the multiplexer may correspond to a different incremental total delay length. The delay length introduced by each of the delay elements may be a common fixed length. The delay length may be 2 ns. More generally, each input may receive the signal delayed by an amount that is longer, by a common delay increment, than the respective amount by which the signal is delayed at another of the inputs. The common delay increment may be equal to a maximum delay divided by the number of multiplexer inputs. The maximum delay may be equal to or longer (e.g. by a safety margin) than the period (e.g. nominal or mean period) of the second clock signal. It may be between one and two periods of the second clock signal.

The delay module may comprise thirty-one (non-trivial) delay elements and a null delay input. In some embodiments, the delay period is the total length of time for which the signal is delayed. This may be a summation of a plurality of delay lengths. The delay module may comprise one or more (e.g. thirty-one) buffers, arranged between the non-trivial delay elements and the corresponding inputs of the multiplexer. The buffers may each introduce the same capacitive load. Providing the same capacitive load after each (non-trivial) delay element can help to ensure that the delay period increases linearly across the inputs of the multiplexer.

The multiplexer may be configured to couple one of the inputs to the output of the delay block. It will be appreciated that different delay periods may be introduced by passing the signal from different inputs, wherein each input corresponds to delay period of a different value.

The multiplexer may comprise a select input, arranged to receive a calibration signal. The multiplexer may determine which input to forward to the output of the delay block depending on the value of the calibration signal. The value of the calibration signal may be one of a plurality of values, each value corresponding to a different desired delay period (which may include a zero delay option). Thus, the delay period may be adjusted by modifying the value of the calibration signal.

Calibrating the adjustable delay period may comprise determining a delay period to be implemented such that received logic transitions are output at or proximate to respective non-active edges of the second clock signal—e.g. less than 25% or 10% or 5% of one second-clock period from a non-active edge.

The detection block may comprise one or more latches (e.g. D-latches). It may comprise additional logic circuitry. The detection block may be arranged to output, e.g. from a D-latch, a logic value indicative of whether, following the output from the delay block of a logic transition in the signal, the next clock edge received at the clock input is an active edge or is a non-active edge. The detection block may be resettable—e.g. so that it can be reset before a subsequent logic transition or signal is received by the synchronisation system.

The detection block may comprise logic circuitry configured to output a first logic value when the next clock edge received at the clock input, following the output from the delay block of the logic transition in the signal, is an active edge. The logic circuitry may be configured to output a second, different logic value when the next clock edge received at the clock input, following the output from the delay block of the logic transition in the signal, is a non-active edge. The logic values may be output to the calibration controller—e.g. over a single binary line, or over a pair of binary lines.

The synchronisation system may comprise a first flip-flop, arranged to sample the (delayed) signal output from the delay block. The first flip-flop may be clocked by the second clock signal. The detection block may be configured to receive a first input from the output of the first flip-flop.

The synchronisation system may comprise a second flip-flop, arranged to sample the (delayed) signal output from the delay block. The second flip-flop may be clocked by an inverted clock signal that is the inverse of the second clock signal (e.g. the second clock signal passed through an inverter). The detection block may be configured to receive a second input from the output of the second flip-flop.

The detection block may be configured to determine whether a logic transition of the signal is sampled by the first flip-flop before the logic transition of the signal is sampled by the second flip-flop. It will be appreciated that, if the logic transition of the (delayed) signal is sampled by the first flip-flop before the logic transition of the (delayed) signal is sampled by the second flip-flop, the (delayed) logic transition will have occurred after a non-active edge and before the next active edge of the second clock signal. Conversely, if the logic transition of the signal is sampled by the second flip-flop before the logic transition of the signal is sampled by the first flip-flop, the logic transition will have occurred after an active edge and before the next non-active edge of the second clock signal.

The synchronisation system may have a calibration mode (i.e. state) and a non-calibration mode (also referred to herein as a transmission mode). In the calibration mode, the electronic device may be configured to provide the synchronisation system with a succession of calibration trigger signals at the signal input. Each calibration trigger signal may comprise a logic transition of a certain type—e.g. a low-to-high logic transition. Each calibration signal may correspond to a respective calibration round in a calibration operation. The calibration trigger signals may be sent at regular intervals—e.g. every five cycles of the first clock signal. The device may be configured always to send a fixed number of calibration signals—e.g. thirty-two—or it may be configured to stop sending calibration trigger signals in response to a signal from the calibration controller that a calibration operation is complete.

When the synchronisation system is in the calibration mode, the detection block may be configured, or controlled by the calibration controller, to output a logic value to the calibration controller in response to every logic transition received at the signal input, or in response to every to every logic transition of a particular type (e.g. every low-to-high transition). Thus, the detection block may be controlled to issue a series of logic values to the calibration controller.

The calibration controller may be a state machine, or it may comprise a processor and a memory storing software for execution by the processor. The calibration controller may be configured to adjust (i.e. to increase or decrease) the delay period incrementally. In some embodiments, the calibration controller is configured to increase the delay period from zero. In some embodiments, the calibration controller is configured to decrease the delay period from a maximum value.

The calibration controller may be configured to receive the logic value(s) (e.g. one or zero) from the detection block indicative of whether, following the output from the delay block of a logic transition in the signal, the next clock edge received at the clock input is an active edge or is a non-active edge. The calibration controller may be configured to store the logic value(s) received from the detection block—e.g. by changing to a different state, or by storing a value in a register or memory.

The calibration controller may be configured to issue a calibration signal to the delay block, which may be a calibration signal as described above. It may be a multi-bit signal. The calibration controller may be configured to set a value of the calibration signal depending on the determination of whether, following the output from the delay block of a logic transition in the signal, the next clock edge received at the clock input is an active edge or is a non-active edge.

The calibration controller may be configured to compare sequential logic values received from the detection block—e.g. to compare a received value with a previous value. The calibration controller may be configured to change the delay period monotonically (e.g. always increasing, or, in some embodiments, always decreasing the delay period) for as long as successively received logic values are all the same value. It will be appreciated that subsequent logic values will be the same while the length of the delay period has not changed by a sufficient amount to cause the logic transitions of successive calibration trigger signals to cross an active or non-active edge of the second clock signal.

The calibration controller may be configured to maintain the delay period when a logic value received from the detection block changes from a predetermined first value to a predetermined second value. In some embodiments, the calibration controller is configured to issue a signal that the calibration mode is complete when the calibration controller detects a predetermined change in the output of the detection block (e.g. when a logic value received from the detection block changes from a predetermined first value to a predetermined second value). In some embodiments, this is when the logic value changes from high to low.

It will be appreciated that this will occur when the former logic signal indicates that the logic transition occurred before (or after) an edge of the second clock signal and the latter logic signal indicates that the logic transition occurred after (or before) an edge of the second clock signal. By detecting a change in output from the detection block that signifies a crossing of the non-active edge of the second clock signal, and stopping the calibration operation in response to this detection, the delay value will be left at a value that aligns the logic transition of the latest calibration trigger signal close to the non-active edge of the second clock signal.

Thus, in embodiments that increase the delay period when the next clock edge is a non-active edge, the calibration controller may be configured to detect, from the output of the detection block, when, following a determination that a non-active edge of the second clock signal was received next after a logic transition of a delayed calibration trigger signal, an active edge of the second clock signal is received next after a subsequent logic transition of the next delayed calibration trigger signal of the succession of trigger signals. (Some embodiments may respond to logic transitions in either direction, while other embodiments may make determinations only for rising logic transitions, or only for falling logic transitions.) The calibration controller may be configured to maintain the delay period when such a detection is made. It will be appreciated that this allows the calibration controller to maintain the length of the delay period when it determines that the delay signal has been delayed such that the logic transition occurs at the time of, or just after, the non-active edge of the second clock signal.

In embodiments that decrease the delay period when the next clock edge is an active edge, the calibration controller may be configured to detect, from the received logic values, when, following a determination that an active edge of the second clock signal was received next (i.e. before a non-active edge) after a logic transition of a delayed calibration trigger signal, a non-active edge of the second clock signal is received next after a subsequent logic transition of the next delayed calibration trigger signal of the succession of trigger signals. The calibration controller may be configured to maintain the delay period when such a detection is made. It will be appreciated that this allows the calibration controller to maintain the length of the delay period when it determines that the delay signal has been delayed such that the logic transition occurs at the time of, or just before, the non-active edge of the second clock signal.

In some embodiments, the synchronisation system may be configured to perform a minimum number of adjustments to the delay period, wherein the minimum may be two or more, before terminating a calibration operation. This can mitigate the risk of clock jitter causing successive trigger signals to cross an active edge in the "wrong" direction (e.g. due to a reduced delay caused by jitter that is larger than the incremental delay increase provided by the delay block), which might otherwise result in a false detection of the signals crossing a non-active edge in the "right" direction (e.g. due to an increased delay). In some embodiments, the number of adjustments made to the delay period before terminating a calibration operation may be (e.g. digitally) configurable.

The calibration controller may be configured to detect, from the output of the detection block, when, following a determination that an active edge of the second clock signal was received next after a logic transition of a delayed signal, a further active edge of the second clock signal is received next after a subsequent logic transition of the next delayed signal. The calibration controller may, in some embodiments, be configured to decrease the delay period in response to this detection.

The calibration controller may be configured to detect, from the output of the detection block, when, following a determination that a non-active edge of the second clock signal was received next after a logic transition of a delayed signal, a further non-active edge of the second clock signal is received next after a subsequent logic transition of the next delayed signal. The calibration controller may, in some embodiments, be configured to increase the delay period in response to this detection.

Thus, it will be appreciated that the calibration controller can monitor the outputs of the detection block and accordingly increase and/or decrease the delay period until it determines that the data signal has been delayed such that the one or more logic transitions occur at the same time as or proximate to (e.g. less than 25% or 10% or 5% of a full second-clock cycle from) a non-active edge of the second clock signal.

The synchronisation system may comprise a third flip-flop configured to sample the output of the first flip-flop. The third flip-flop may be clocked with the same second clock signal as the first flip-flop (i.e. not inverted). Thus, the third flip-flop together with the first flip-flop may form a two-flip-flop synchroniser. Providing an additional flip-flop to form a two-flip-flop synchroniser adds a further layer of protection to ensure that the signal is output without metastability when the system has not yet been calibrated or if the calibration process were to fail.

The synchronisation system may comprise a logic gate arranged to receive an enable signal from the calibration controller and an output from the third flip-flop. The logic gate may be an AND gate. This allows the output from the two-flip-flop synchroniser to be issued in dependence on a value of the enable signal. Thus, the value of the enable signal may be set such that it corresponds to a calibration mode of the synchronisation system, in which the output from the two-flip-flop synchroniser is prevented from issuing from an output of the logic gate, and a transmission mode of the synchronisation system, in which the output from the two-flip-flop synchroniser is forwarded from an output of the logic gate.

The synchronisation system may be configured or controlled (e.g. by a processor on the device) to change from calibration mode to transmission mode when the calibration controller detects a predetermined change in the output of the detection block—e.g. signifying that the delay period is such that a logic transition is received at or proximate to a non-active edge of the second clock signal. In the transmission mode, the electronic device may be configured to provide the synchronisation system with signals at the signal input, such as trigger signals for triggering actions in the destination clock domain. In the transmission mode, the electronic device may be configured to allow the synchronisation system to output these signals, delayed by the calibrated delay period. When changing from calibration mode to transmission mode, the electronic device may be configured to stop providing the synchronisation system with a succession of calibration trigger signals at the signal input.

Thus embodiments of the present invention may calibrate the delay period so that the logic transition is issued (e.g. to the input of a two-flip-flop synchroniser) at a point in the second clock signal that is far (e.g. furthest) from the dangerous setup and hold regions of the second clock signal. This means that the risk of metastability, leading to an uncertainty of one clock cycle, may be substantially reduced.

The device may comprise a thermometer or an input for receiving a signal representative of a temperature of the device or of the environment. The device may be configured to calibrate the synchronisation system upon detecting that the temperature is above or below an accepted temperature range.

The device may comprise a power supply, or a connection for a power supply. It may comprise one or more processors, RAM, non-volatile memory, clock sources, connections to external clock sources, inputs, outputs, peripherals, etc. In some embodiments, it may comprise a radio and may be configured to perform radio distance ranging. It may be configured to transmit a radio signal in response to a trigger signal received by the synchronisation system.

BRIEF DESCRIPTION OF THE DRAWINGS

Some embodiments of the invention will now be described, by way of non-limiting example only, with reference to the accompanying drawings in which.

DETAILED DESCRIPTION

The following description considers the transmission of a trigger signal between clock domains, by way of example, but it will be appreciated that the same principles can be applied to other types of signal, such as data signals (e.g. in a handshaking-based bus synchroniser).

Figure 1:
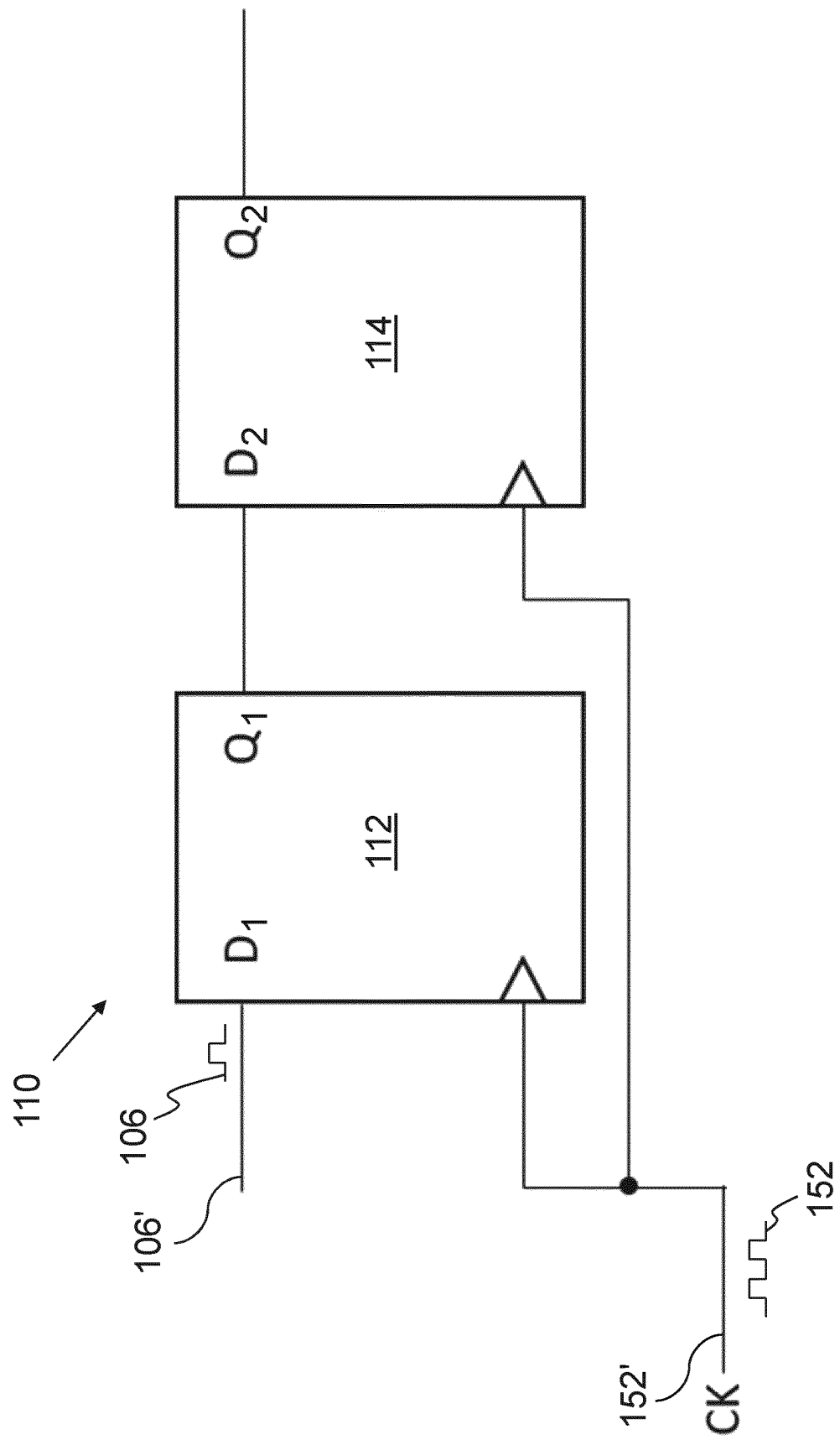
FIG. 1 is a schematic of a conventional two-flip-flop synchroniser.

FIG. 1 is a schematic of a conventional two-flip-flop synchroniser 110. Such synchronisers are implemented to synchronise a signal sent from a source clock domain to a destination clock domain in order to prevent metastability.

A conventional two-flip-flop synchroniser comprises a first flip-flop 112 and a second flip-flop 114. Both the first 112 and the second flip-flop 114 are arranged to receive a clock signal 152 of the destination domain. The clock signal 152 is a square-wave signal comprising an active (rising) edge and a non-active (falling) edge.

The first flip-flop 112 comprises an input $D_1$ arranged to receive a trigger signal over a trigger line 106. Once the trigger signal 106 is sent to the input $D_1$ of the first flip-flop 112, the first flip-flop 112 is arranged to sample the trigger signal 106 upon the a first rising edge of the clock signal 152 received over a clock line 152'. After this occurs, the sampled signal is forwarded via the output $Q_1$ of the first flip-flop 112.

After a full cycle of the clock signal 152, the second flip-flop 114 samples the output $Q_1$ of the first flip-flop 112 upon a second rising edge of the clock signal 152, and then outputs this signal via the output $Q_2$ of the second flip-flop 114.

For each of the flip-flops 112, 114, the active edge of the clock signal 152 is immediately preceded by a 'setup' period and immediately succeeded by a 'hold' period. During these periods, the input to the first flip-flop 112 must be a stable value if a metastable output is to be avoided. If the value of the trigger signal 106 is changed during the setup or hold regions of the clock signal 152, the first flip-flop 112 may become metastable. This means that the sampled trigger signal may stabilise to a zero or a one, regardless of the value of the trigger signal 106. The second flip-flop 114 will sample this value at the next (second) rising edge of the clock signal 152 and output the signal from $Q_2$. For a given instance, the value to which the signal stabilises cannot be reliably determined.

If the first flip-flop 112 becomes metastable, there are two possible cases for the subsequent operation of the synchroniser 110. In a first case, the sampled trigger signal stabilises to a value that is the opposite of the updated value of the trigger signal 106. In this case, the change in the trigger signal value will not be observed at the output of the synchroniser 110 at the second rising edge of the clock signal 152, as the second flip-flop 114 samples an apparently unchanged value of the trigger signal 106.

The first flip-flop 112 resamples the trigger signal 106 at the second rising edge of the clock signal 152. At the third rising edge of the clock signal 152, the second flip-flop 114 samples the output $Q_1$ of the first flip-flop 112. Accordingly, assuming that the trigger signal 106 is held at the updated value for at least two cycles of the destination clock signal 152, the change in the trigger signal 106 is observed at the output of the synchroniser 110 at the third rising edge of the clock signal 152.

In the second case, the sampled trigger signal stabilises to the updated value of the trigger signal 106. At the second rising edge of the clock signal 152, the second flip-flop 114 samples this value at the output $Q_1$ of the first flip-flop 112. Thus, the change in the trigger signal 106 is observed at the output $Q_2$ of the synchroniser 110 at the second rising edge of the clock signal 152.

Thus, as it cannot be determined which of the two cases discussed above will occur, there is an uncertainty of one clock cycle about the time at which the change in the trigger signal 106 will be observed at the output of the synchroniser 110.

Some embodiments of the present invention address this by introducing a delay to a trigger signal 6 that is provided at the input $D_1$ of the first flip-flop 12 of a two flip-flop synchroniser 10 that is similar to the synchroniser 110 shown in FIG. 1. The length of this delay is calibrated to ensure that the change in value of the trigger signal 6 does not occur during the setup or hold times of a destination clock signal 52. Instead, the trigger signal 6 is delayed so that it is asserted (or removed) close to the non-active edge of the clock signal 52.

This can maximise the amount of time between the change in value of the trigger signal 6 and the active edge of the clock signal 52, thereby substantially reducing the risk of the first flip-flop 12 becoming metastable. As a result, it is possible to ensure that the uncertainty discussed above is eliminated or at least substantially reduced.

Figure 2:
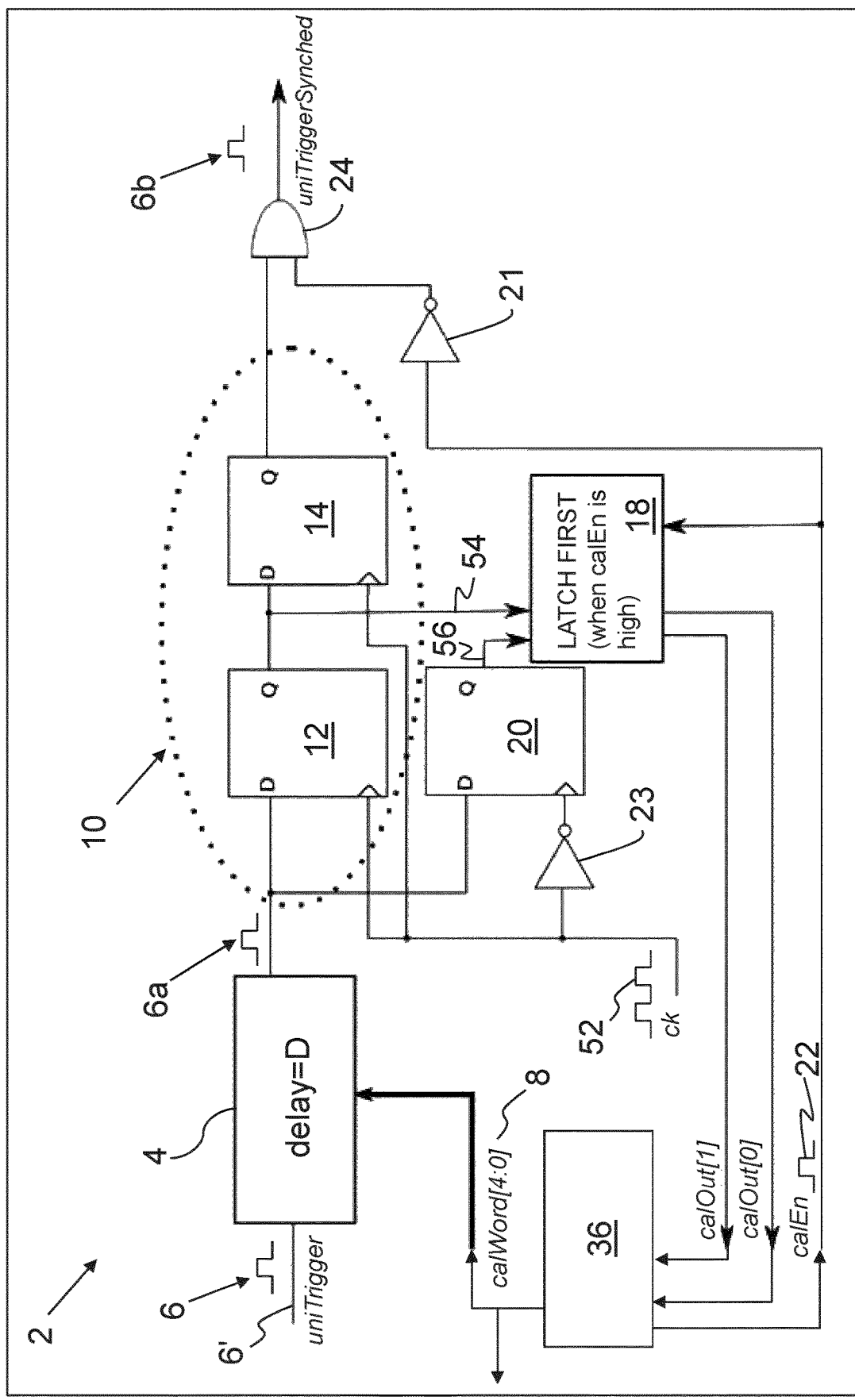
FIG. 2 is a schematic of a synchronisation system for sending a signal from a source domain to a destination domain, in accordance with an embodiment of the present invention.

FIG. 2 is a schematic illustrating an implementation of a synchronisation system (circuit) 2 in an electronic device 200, in accordance with an embodiment of the present invention. The device 200 may be a system-on-chip.

The synchronisation system 2 comprises a configurable delay module 4, configured to receive a source trigger signal 6 and a delay length signal 8 encoding a 5-bit delay value, calWord. The delay module 4 comprises a multiplexer (see FIG. 4) arranged to receive the source trigger signal 6 as an input and to output a delayed trigger signal 6a, wherein the delayed trigger signal 6a is delayed by a delay length corresponding to the value of the delay length signal 8.

Figure 5:
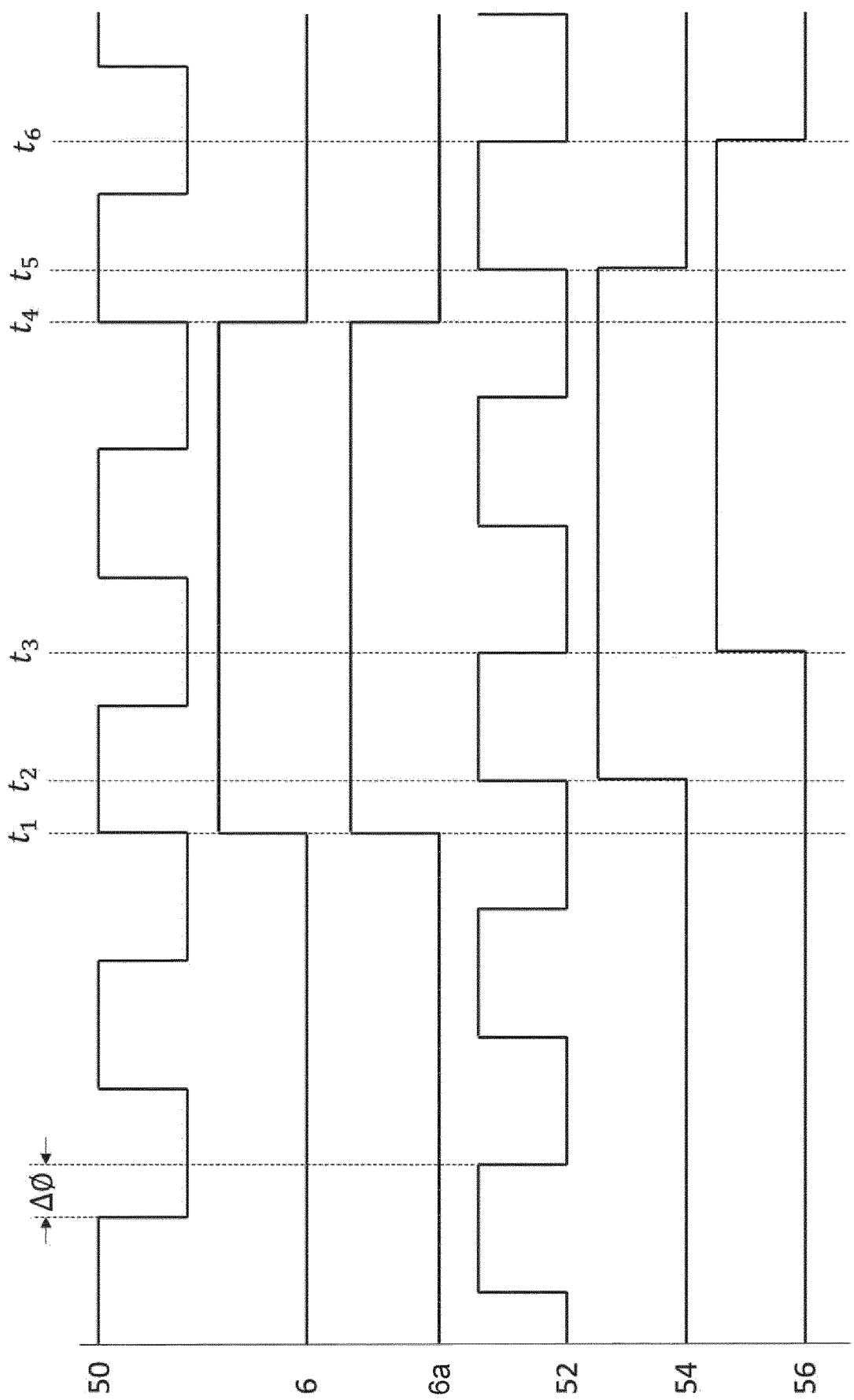
FIG. 5 is a timing diagram showing example outputs of the components in the system shown in FIG. 2 when no delay is introduced by the delay module.
Figure 6:
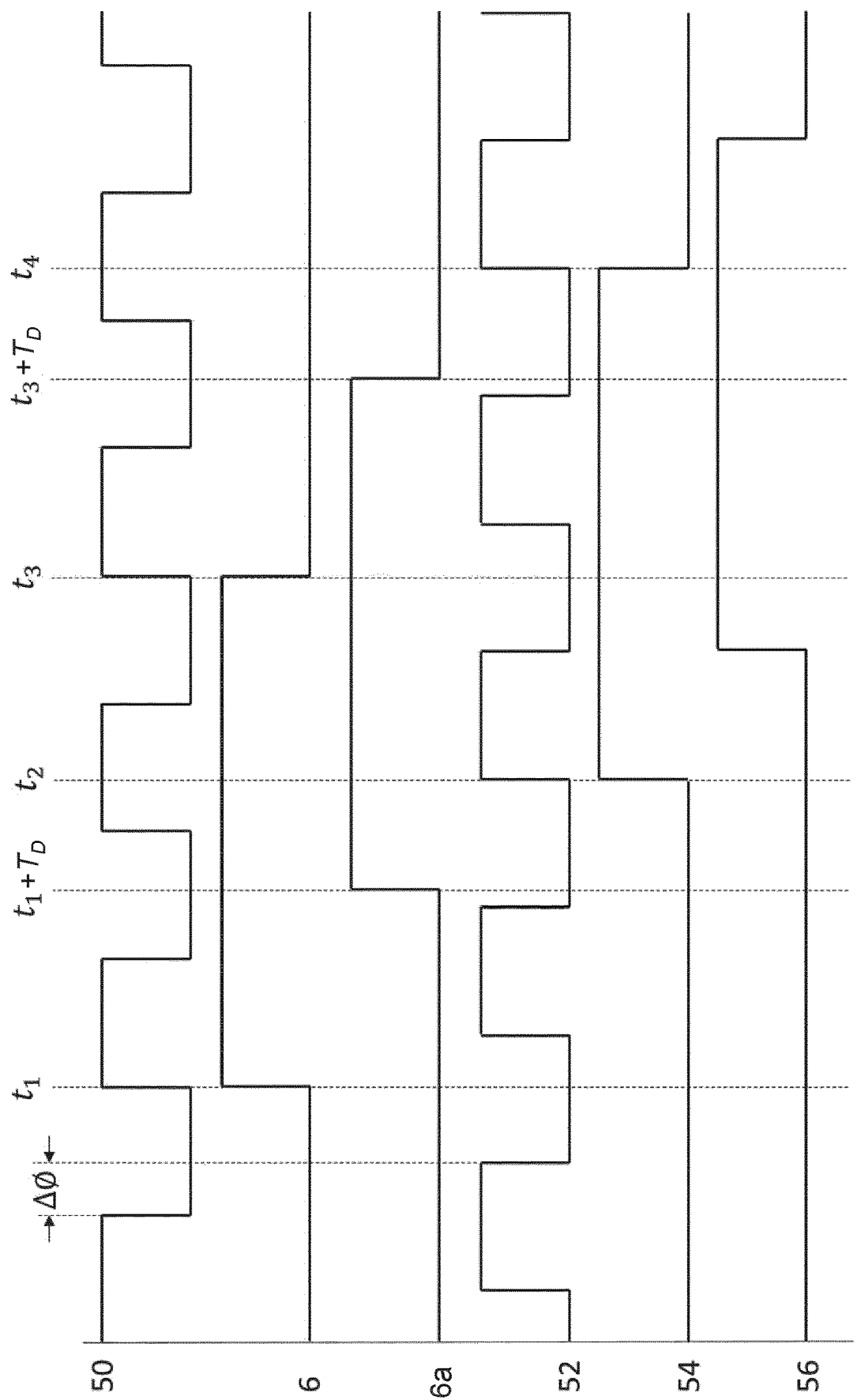
FIG. 6 is a timing diagram showing example outputs of the components in the system shown in FIG. 2 after calibration of the delay length signal.

The source trigger signal 6, uniTrigger, may be provided by a processor or other triggering circuit (not shown), that are located within a source clock domain of the device 200. The source domain comprises a source domain clock (not shown) that is configured to output a source domain clock signal 50, which is a square wave signal at a fixed frequency (as shown in FIGS. 5 and 6). The source domain clock signal 50 therefore provides both a rising edge and a falling edge.

The source trigger signal 6 may be prompted by a hardware or a software event. The triggering circuit is configured such that it only outputs a source trigger signal 6 on a rising edge of the source domain clock signal, i.e. the rising edge is the active edge of the clock signal.

The delayed trigger signal 6*a* is forwarded from the output of the delay module 4 to the input of a two flip-flop synchroniser 10. The synchroniser 10 comprises a first flip-flop 12 and a second flip-flop 14.

The first 12 and second 14 flip-flops are located within a destination clock domain. The destination domain is clocked by a destination domain clock that is configured to output a square wave signal 52 at the same frequency as that of the source domain clock signal 50. A phase difference can exist between the source domain clock signal 50 and the destination domain clock signal 52.

The first 12 and second 14 flip-flops are configured to sample their inputs on the rising edge of the destination domain clock signal 52. The first flip-flop 12 samples the delayed trigger signal upon a first rising edge of the destination domain clock. After a full cycle of the destination domain clock signal 52, the second flip-flop 14 samples the output of the first flip-flop upon a second rising edge of the destination domain clock signal 52.

In normal use (also referred to herein as transmission mode), once the synchronisation system 2 has been calibrated, the system 2 will pass the synchronised trigger signal 6*b* through the AND gate 24 and the trigger signal 6*b* can then safely be used to trigger any desired action in circuitry within the destination cock domain.

Now follows a description of the components and operations that are involved in calibrating the synchronisation system 2—i.e. in determining an optimal delay for the delay module 4 to apply.

This calibration operation requires the synchronisation system 2 to be fed with a succession of trigger signals 6 (e.g. by a processor in the first clock domain). The synchronisation system 2 uses each trigger signal 6 to apply an incremental adjustment to the delay (where required), in a succession of calibration rounds, until the delay settles on an optimal value. A new calibration round may be performed every five clock cycles of the source clock, during the calibration operation.

The synchronisation system 2 includes a calibration controller 36 for controlling the delay length. This controller 36 may be hardware logic implementing a finite state machine, or it may include a processor executing software instructions, or a combination of both. It outputs a delay length signal 8 to the configurable delay module 4 as a five-bit binary word, calWord, that can be adjusted to vary the delay length, in uniform increments, between zero delay and a maximum delay value (which is set to be a little larger than the maximum length that one destination clock period might have under extreme operating conditions).

The controller 36 can be configured (e.g. by a separate processor on the device 200) to perform a calibration operation at intervals—e.g. every ten seconds and/or in response to a large change in ambient temperature. The device 200 may also perform an initial calibration when it is booted up. Each calibration operation may result in an updated value for the delay value calWord (which may be unchanged in some instances).

To perform the calibration operation, the synchronisation system 2 further comprises a detection block 18 and a third flip-flop 20 in the destination clock domain.

The detection block 18 is configured to receive a calibration-enable signal 22, calEn, from the calibration controller 36. During a calibration mode of the system 2 the calibration-enable signal 22 is set to logic HIGH by the controller 36 for at least two clock cycles at the start of each calibration round. This enables the detection block 18 and prevents the calibration trigger signal 6 from being output by the synchronisation system 2, as explained in more detail below. It is lowered after each calibration round in order to reset the detection block 18.

The calibration rounds may be performed at regular intervals (e.g. every k clock cycles, for some k) during the calibration operation. When calibration is not being performed (i.e. in a normal transmission mode), the enable signal 22 is maintained at logic LOW. The detection block 18 comprises two binary outputs calOut[0] and calOut[1]. When the calibration-enable signal 22 is logic LOW (i.e. between calibration rounds or when the calibration mode is not active), the outputs calOut[0] and calOut[1] are set to logic LOW.

The destination domain further comprises an AND gate 24 arranged to issue a synchronised version 6*b*, uniTriggerSynced, of received the trigger signal 6 uniTrigger, once it has been synchronised by the delay module 4 and two flip-flop synchroniser 10. The AND gate 24 receives the output of the two flip-flop synchroniser 10 and the inverted calibration-enable signal 22 (generated by a NOT gate 21), as inputs. Thus, when the calibration-enable signal 22 is LOW, the synchronised trigger signal 6*b* is permitted to be output from the system via the AND gate 24. Conversely, when the calibration-enable signal 22 is HIGH, when the calibration mode is active, the trigger signal does not pass through the AND gate and is not output from the synchronisation system 2, so as to avoid unwanted triggering of actions in the downstream circuitry.

The third flip-flop 20 is configured to receive an inverted clock signal from the destination domain clock, generated by a NOT gate 23 which receives the destination-domain clock signal 52. The third flip-flop 20 samples the delayed trigger signal 6*a*, output from the configurable delay module 4, upon a first rising edge of the inverted destination domain clock signal, i.e. a falling edge of the non-inverted destination domain clock signal 52. The output of the third flip-flop 20 is passed to the detection block 18.

The detection block 18 is further arranged to receive the output of the first flip-flop 12. Thus, the detection block 18 receives a signal from both the first flip-flop 12, representing the output state of the delay module 4 at each the rising edge of the destination domain clock signal 52, and the third flip-flop 20, representing the output state of the delay module 4 at each falling edge of the destination domain clock signal 52—i.e. offset by half a cycle. While the enable signal 22 is set to logic HIGH (i.e. during a calibration operation), the detection block 18 is configured to output a logic HIGH signal via either calOut[0] or calOut[1], depending on whether the signal from the first flip-flop 12 is received before or after the signal from the third flip-flop respectively.

Upon entering the calibration mode (i.e. upon commencing a calibration operation), the calibration controller 36 initially sets the value of the delay length signal 8, calWord, such that the delay length applied by the delay module 4 is zero (e.g. by setting the delay length signal 8 to 00000'b).

As will be described in more detail below, with reference to FIG. 3, the detection block 18 is configured to set the output calOut[0] to logic HIGH (and calOut[1] to LOW) if the output 54 from the first flip-flop 12 goes high before the output 56 from the third flip-flop 20 goes high. This will occur when the delayed trigger signal 6a has been received while the destination domain clock signal 52 is LOW (i.e. in the second half of the destination clock cycle). If, on the other hand, the output from the third flip-flop 20 goes high before the output from the first flip-flop 12, the detection block 18 is configured to set the output calOut[1] to logic HIGH (and calOut[0] to LOW), which will occur when the delayed trigger signal 6a has been received while the destination domain clock signal 52 is HIGH (i.e. in the first half of the destination clock cycle).

After each assertion of the enable signal 22 (i.e. each time the enable signal returns to logic LOW), the detection block 18 resets the values of the outputs calOut[0] and calOut[1] to logic LOW.

After each calibration round, the value of the delay length signal 8 is adjusted such that the delay length is increased by a fixed increment, and the next delayed trigger signal 6a from the succession of trigger signals 6 is sampled by the first 12 and third 20 flip-flops. Once again, the detection block 18 determines which of the flip-flops goes high first and accordingly outputs a logic HIGH signal on either calOut[0] or calOut[1], as discussed above.

This process is repeated until the delay value (calWord) has been incremented sufficiently that, following a previously received logic HIGH calOut[1] for the preceding trigger signal 6, a logic HIGH calOut[0] is received. This is the case when the delayed trigger signal 6a is delayed to the extent that it is received just after the falling (i.e. non-active) edge of the destination domain clock signal 52, while the immediately preceding delay trigger signal 6a was received just before the falling edge in the preceding. Thus, this represents the point that the delayed signal 6b transitions from being output by the delay module 4 while the destination domain clock signal 52 is logic HIGH to being output while the destination domain clock signal 52 is logic LOW.

When this transition is determined to have occurred, the value of the delay length signal 8, calWord[4:0], is fixed at its current value, thus fixing the length of the delay $T_D$ that is applied to future trigger signals 6 received by the synchronisation system 2 until the next calibration operation is initiated. Such a determination also causes the controller 36 set the enable signal 22 to logic LOW, and exit the calibration mode.

Until this determination is made (i.e. if calOut[0] is still LOW, or if calOut[0] has been HIGH since the first calibration round and has not yet gone LOW), the value of the delay length signal 8 is adjusted after each assertion of the calibration-enable signal 22 such that the delay length is incrementally increased until the above-described transition occurs.

In some embodiments, the device 200 may be configured to perform a minimum of three calibration rounds (i.e. making at least two calibration adjustments) even if the second calibration round appears to have met the test above. This is to avoid the situation in which the first calibration trigger signal arrives just after a rising second-domain clock edge (with zero delay applied), and jitter in the source and/or destination clock is larger than the delay increment and so causes the next (delayed) trigger signal to be sampled just before a rising second-domain clock edge—i.e. having been shifted in the wrong direction. By the time two increments have been made, this risk may have been reduced to an acceptably small level.

Figure 3:
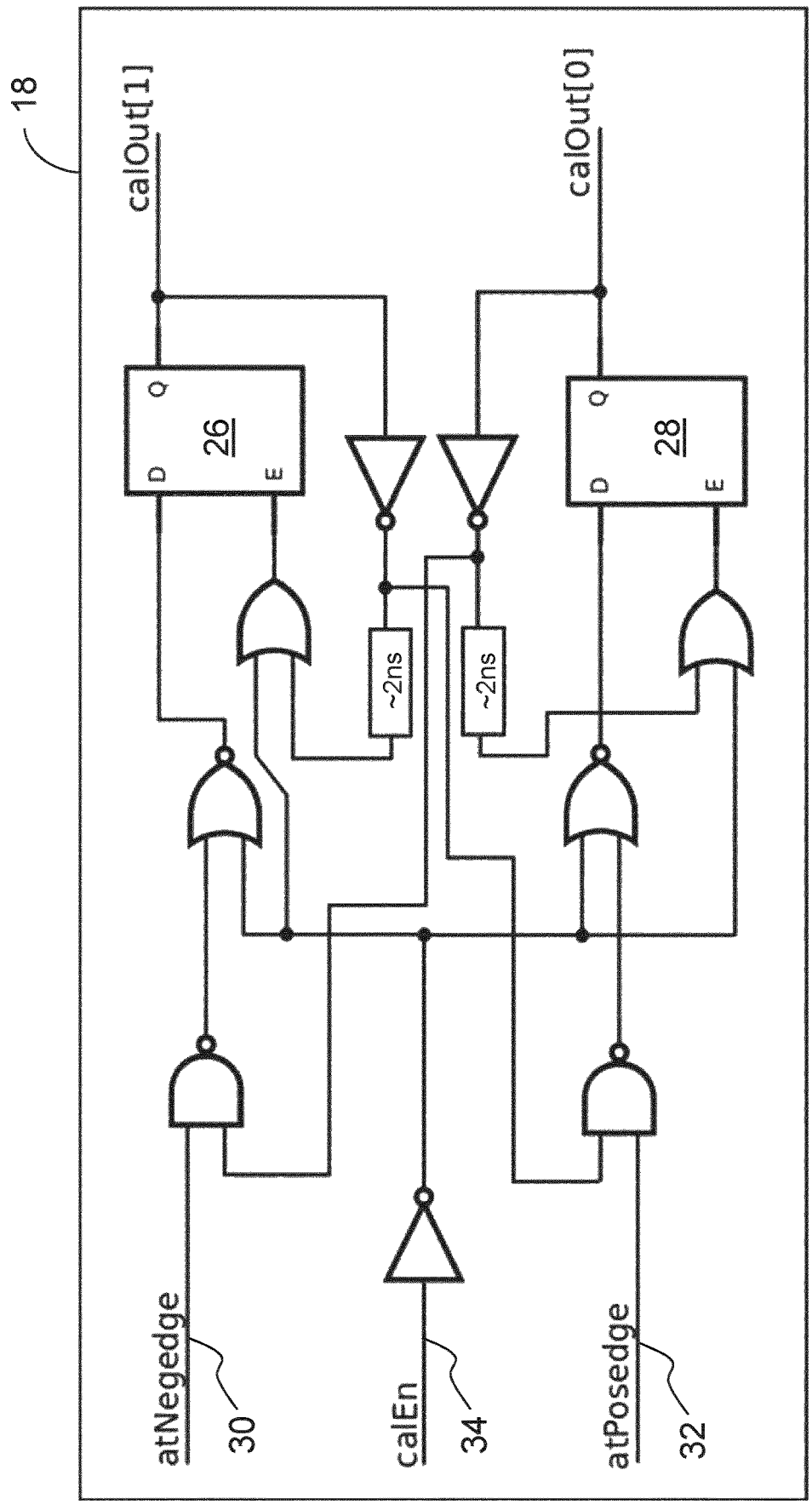
FIG. 3 is a schematic of the detection block shown in FIG. 2.

FIG. 3 shows a schematic of the detection block 18. The detection block 18 comprises a first input 30 (atNegedge), a second input 32 (atPosedge) and a calibration enable input 34 (calEn). The first input 30 is arranged to receive the output 56 of the third flip-flop 20. The second input 32 is arranged to receive the output 54 of the first flip-flop 12. The calibration enable input 34 is arranged to receive the calibration-enable signal 22.

The detection block 18 further comprises a first D-latch 26 and a second D-latch 28. The first 26 and second 28 D-latches are each enabled by a logic HIGH signal at their respective enable E inputs, which occurs when their respective outputs are LOW or when calEn is LOW (i.e. when the detection block 18 is being reset).

The first D-latch 26 is arranged to output a signal calOut[1]. The signal calOut[1] is set to logic HIGH from logic LOW in response to a logic HIGH signal from the third flip-flop 20 at the first input 30, so long as the output calOut[0] is still at LOW (i.e. so long as a logic HIGH signal from the first flip-flop 12 has not been received at the second input 32 since the detection block 18 was last reset).

The second D-latch 28 is arranged to output a signal calOut[0]. The signal calOut[0] is set to logic HIGH from logic LOW in response to a logic HIGH signal from the first flip-flop 12 at the second input 32, so long as the output calOut[1] is still at LOW (i.e. so long as a logic HIGH signal from the third flip-flop 20 has not been received at the first input 30 since the detection block 18 was last reset).

Once one of calOut[0] and calOut[1] has gone HIGH, the detection block 18 does not respond to further changes at the first input 30 and the second input 32 until calEn has been deasserted. After each assertion of the calibration-enable signal 22 (i.e. each time the enable signal returns to logic LOW), the outputs calOut[1] and calOut[2] are set to logic LOW.

The calibration controller 36 is arranged to receive the signals calOut[1] and calOut[0] from the detection block 18. The controller 36 detects when one of calOut[1] and calOut[0] goes high, after asserting the enable signal 22, and is arranged to increment the value of the delay signal 8 in response, in each calibration round, as required until the controller 36 determines from the received signals calOut[1] and calOut[0] that a transition (as discussed above) has occurred. Once this has occurred, the controller 36 sets the enable signal 22 to logic LOW. It may signal to the source of the calibration trigger signals (e.g. a processor in the source clock domain) that the calibration operation has finished (thus terminating calibration mode).

The controller 36 can also make the value of the final calibrated delay, calWord, available to other parts of the chip, such as a processor or logic in the source clock domain, which may, in some embodiments, use this to determine in which destination clock cycle any subsequent trigger signal 6 will be detected. In particular, if the delay value corresponds to a delay of less than half a cycle, the source circuitry may infer that each trigger signal will be output by the synchronisation system 2 after a delay of two clock cycles; if the delay value corresponds to a delay of more than half a cycle, the source circuitry may infer that each trigger signal will be output by the synchronisation system 2 after a delay of three clock cycles. This information may be useful to the triggering circuitry in some applications. However, even without this information, the synchronisation system 2, once calibrated, can ensure a consistent detection delay for each trigger signal, by eliminating the possibility of unpredictable metastability effects, which may be sufficient in other applications.

Figure 4:
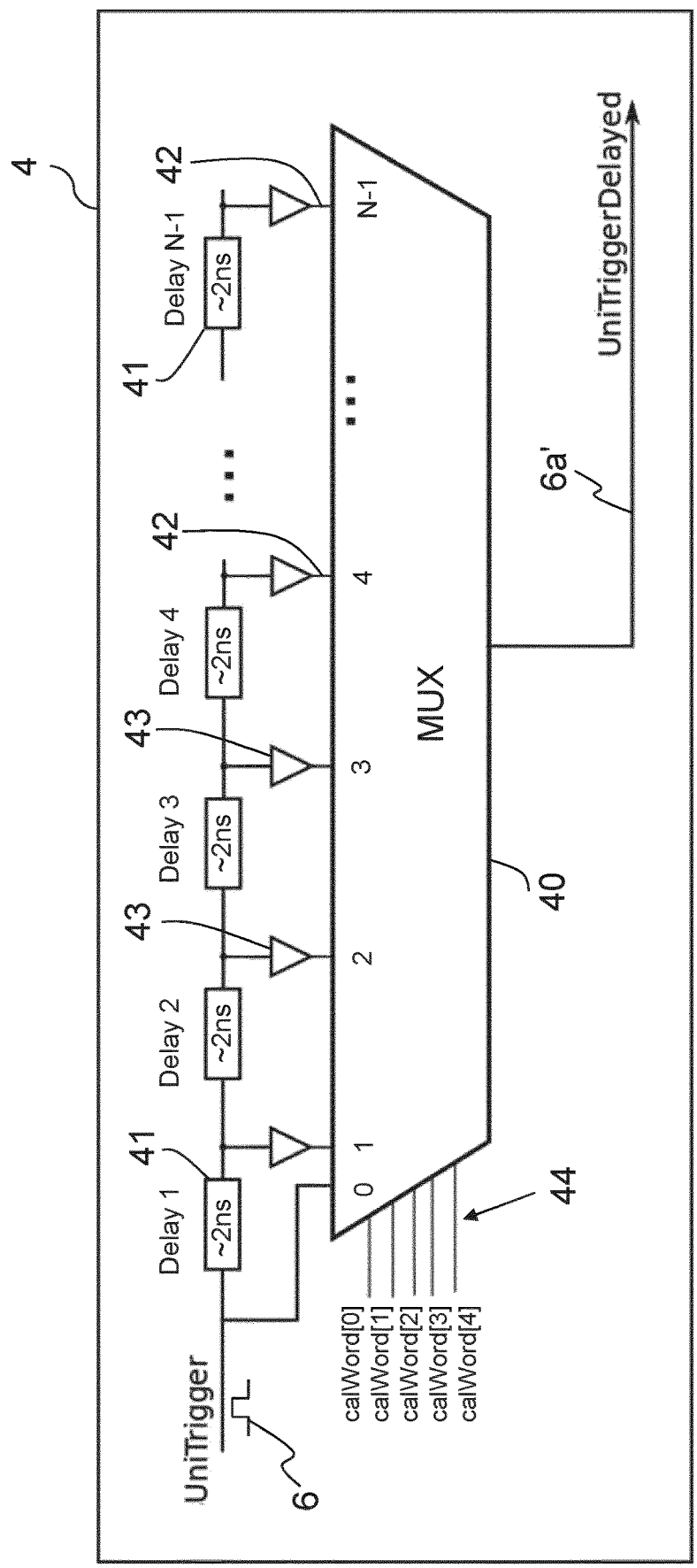
FIG. 4 is a schematic of the configurable delay module of FIG. 2.

FIG. 4 shows a schematic of the configurable delay module 4, which comprises a multiplexer 40. The multiplexer 40 comprises thirty-two trigger inputs 42 indexed from n=0 to n=31 and a single output line 6a'. Each trigger input 42 receives the source trigger signal 6 from the triggering component delayed by a respective delay length of $T_D=(2.n)$ nanoseconds. These delays are provided by a set of thirty-one two-nanosecond delay blocks 41.

The configurable delay module 4 further comprises a set of buffers 43 arranged between the delay blocks 41 and the trigger inputs 42. The buffers 43 help to ensure that the capacitive load for the delay blocks 41 is unaffected by the method of implementation of the multiplexer 40. Providing the same capacitive load after each delay block 41 helps to ensure that the incremental delay from inputs n=0 to n=31 is as linear as possible. This makes it possible to use conventional synthesis tools to implement the multiplexer 40 from a hardware description language (HDL) whilst ensuring a linear configurable delay module 4.

The multiplexer 40 further comprises five select line inputs 44, calWord[4:0], which are used to select which trigger input 42 to forward to the output line 6a'. Each select line 44 corresponds to a bit in the five-bit delay length signal 8, calWord. A delay length $T_D=2n$ is selected when the value of the corresponding binary delay length signal 8 is equal to the input index n. Thus, the multiplexer 40 is arranged to forward to the output line 6a' the source trigger signal that has been delayed by an amount $T_D$ corresponding to the value of the delay length signal 8.

Operation of the system 2 will now be described, with reference to FIG. 5 and FIG. 6.

FIG. 5 shows a timing diagram of the synchronisation system 2 shown in FIG. 2, with the delay length signal 8 set to 00000'b (i.e. delay length $T_D=0$ ns) at the start of a calibration operation.

FIG. 5 shows the source domain clock signal 50, the destination clock domain signal 52, the source trigger signal 6, the delayed trigger signal 6a, the output 54 of the first flip-flop 12 and the output 56 of the third flip-flop 20.

As can be seen, the source domain clock signal 50 and the destination clock domain signal 52 have the same frequency but are out of phase by an unknown amount $\Delta\varnothing$.

The source trigger signal 6 is sent at time $t_1$. As the delay length $T_D=0$ ns, the delayed trigger signal 6a leaves the delay block 4 at time $t_1$ (without delay).

Consequently, the inputs to both the first flip-flop 12 and the third flip flop 20 are set to logic HIGH at time $t_1$. The first flip-flop 12 samples its input at the time $t_2$ of the next rising edge of the destination clock domain signal 52.

As the third flip-flop 20 receives an inverted destination domain clock signal, the third flip-flop 20 samples its input at time $t_3$, which is the time of the next falling edge of the non-inverted destination domain clock signal 52.

At time $t_4$, the source trigger signal 6 returns to logic LOW. In this example, the trigger signal 6 is asserted for two clock cycles to ensure it arrives safely in the destination domain even if a calibration of the synchronisation system 2 has not been performed. Once the system 2 has been calibrated, a single clock cycle trigger signal can safely be used. The delayed trigger signal 6a is immediately set to logic LOW at time $t_4$ (without delay). The inputs to both the first flip-flop 12 and the third flip flop 20 are therefore set to logic LOW at time $t_4$. At the next rising edge of the destination domain clock signal 52 (at $t_5$), the first flip-flop 12 samples its input and consequently outputs a logic LOW signal 54. At the next falling edge of the destination domain clock signal 52 (at $t_6$), the third flip-flop 20 samples its input and consequently outputs a logic LOW signal on its output 56.

In FIG. 5, as the logic HIGH signal from the first flip-flop 12 is output before the logic HIGH signal from the third flip-flop 20, the detection block 18 will output a logic HIGH calOut[0] signal to the calibration controller 36, as discussed above with reference to FIG. 3.

The falling logic transition of the trigger signal 6, at time $t_4$, is not used for the calibration in these embodiments, but in some embodiments a detection block may be provided that can determine the order for both rising and falling edges, which might allow a new calibration round to be performed on each received logic transition, rather than alternate edges. This may, however, require more complex detection block circuitry.

Subsequently, the system 2 is configured to increase the delay applied to the trigger signal 6. As successive calibration trigger signals 6 are received, the outputs from the detection block 18 will first transition from logic HIGH calOut[0] to logic HIGH calOut[1], and then from logic HIGH calOut[1] to logic HIGH calOut[0], in accordance with the processes described above. Once the latter transition has occurred, the controller 36 is configured to end the calibration operation and the delay length is set.

FIG. 6 shows a timing diagram of the synchronisation system 2 shown in FIG. 2, after calibration of the delay length signal—i.e. during the normal transmission mode.

FIG. 6 shows the source domain clock signal 50, the destination clock domain signal 52, the source trigger signal 6, the delayed trigger signal 6a and the output 54 of the first flip-flop 12. The output 56 of the third flip-flop 20 is also shown. However, it will appreciated that, while calibration mode is disabled, the output 56 of the third flip-flop 20 is disregarded by the detection block 18. While calibration mode is disabled, the outputs of the detection block 18 calOut[0] and calOut[1] are both maintained at logic LOW.

The source trigger signal 6 is sent at time $t_1$. During calibration, the value of the delay length signal 8 will have been set such that the multiplexer 40 in the delay module forwards the trigger signal with a delay of $T_D$ ns. Therefore, the delayed trigger signal 6a is issued at time $t_1+T_D$. It will be appreciated that this occurs just after the next falling edge of the destination domain clock signal 52. Thus, the delayed trigger signal 6a at the input to the first flip-flop 12 has close to half a full clock cycle in which to stabilise so that the output of the first flip-flop 12 is not metastable.

The first flip-flop 12 samples its input at time $t_2$, which is the time of the next rising edge of the destination clock domain signal 52.

At time $t_3$, the source trigger signal 6 returns to logic LOW. Thus, the delayed trigger signal 6a is set to logic LOW at time $t_3+T_D$. The inputs to both the first flip-flop 12 and the third flip flop 20 are therefore set to logic LOW. At the next rising edge of the destination domain clock signal 52 (at $t_4$), the first flip-flop 12 samples its input and consequently outputs a logic LOW signal 54.

It can be seen from FIG. 6 that the synchronisation system 2 is here calibrated to introduce the specific delay length required to ensure that the delayed signal 6a is received by the first flip-flop 12 as close as possible after the falling edge of the destination domain clock signal 52 (within the precision limit of the delay unit 4). As this is the point furthest from the active edges of the destination domain clock signal 52, the time available for the output from the first flip-flop 12 to stabilise is maximised, thus reducing the likelihood that the second flip-flop 14 will sample a transitioning input and output a metastable signal. If the phase offset between the source and destination clock domains is completely constant (e.g. with both clock signals being derived from the same crystal oscillator), it may possible to eliminate the risk of metastability completely. The second flip-flop 14 may be omitted in some embodiments, however it may be useful to include as a precaution in case calibration fails for any reason, or if the system 2 may sometimes be used to pass signals without having been calibrated.

It will be appreciated by those skilled in the art that the invention has been illustrated by describing one or more specific embodiments thereof, but is not limited to these embodiments; many variations and modifications are possible, within the scope of the accompanying claims. For example, embodiments have been described in which the rising edge is the active edge, but other embodiments may have the falling edge as the active edge.

The invention claimed is:

1. An electronic device comprising a synchronization system, wherein the synchronization system comprises:
   a signal input for receiving a signal clocked by a first clock signal having a first frequency;
   a clock input for receiving a second clock signal having said first frequency, but offset in phase from the first clock signal, wherein the second clock signal comprises a repeated sequence of alternating active and non-active clock edges;
   a delay block arranged to delay the signal by an adjustable delay period, and to output the signal delayed by said delay period, wherein the delay period is adjustable at a resolution finer than one clock period of the second clock signal; and
   a calibration system for calibrating the adjustable delay period,
   wherein the calibration system comprises:
   a detection block configured to determine whether, following the output of a logic transition from the delay block, the next clock edge received at the clock input is an active edge or is a non-active edge; and
   a calibration controller configured to increase the delay period when the next clock edge is a non-active edge and to maintain or decrease the delay period when the next clock edge is an active edge, or configured to decrease the delay period when the next clock edge is an active edge and to maintain or increase the delay period when the next clock edge is a non-active edge.

2. The electronic device of claim 1, wherein the second clock signal is offset from the first clock signal by a non-zero phase offset.

3. The electronic device of claim 1, wherein the delay period is selectable from a plurality of predetermined delay periods.

4. The electronic device of claim 1, wherein the delay block comprises:
   one or more delay elements, wherein each delay element is arranged to receive the signal and to output the signal delayed by a different respective delay length; and
   a multiplexer, comprising a plurality of inputs, wherein one or more of the inputs is arranged to receive the output from a respective delay element, and wherein the multiplexer is configured to couple one of the inputs to an output of the delay block.

5. The electronic device of claim 4, comprising two or more said delay elements, wherein the two or more delay elements are arranged in series such that a second delay element receives the delayed output of a first delay element.

6. The electronic device of claim 4, wherein the delay block is arranged such that each of a plurality of inputs of the multiplexer receives the signal delayed by an amount that is larger, by a common delay increment, than a respective amount by which the signal is delayed at another of the inputs.

7. The electronic device of claim 1, wherein the synchronization system comprises a first flip-flop and a second flip-flop, wherein both the first flip-flop and the second flip-flop are arranged to sample the delayed signal output from the delay block.

8. The electronic device of claim 7, wherein the first flip-flop is clocked by the second clock signal and the second flip-flop is clocked by an inverted clock signal that is the inverse of the second clock signal.

9. The electronic device of claim 7, wherein the detection block is configured to:
   receive a first input from the output of the first flip-flop;
   receive a second input from the output of the second flip-flop; and
   determine whether a logic transition of the signal output from the delay block is sampled by the first flip-flop before the logic transition of the signal is sampled by the second flip-flop.

10. The electronic device of claim 1, wherein the detection block is arranged to output a logic value indicative of whether, following the output from the delay block of a logic transition, the next clock edge received at the clock input is an active edge or is a non-active edge.

11. The electronic device of claim 1, wherein, when the synchronization system is in a calibration mode, the detection block is configured to output a respective logic value to the calibration controller in response to every logic transition received at the signal input, or in response to every to every logic transition of a particular type, each logic value being indicative of whether, following the output from the delay block of a respective logic transition in the signal, the next clock edge received at the clock input is an active edge or is a non-active edge.

12. The electronic device of claim 11, wherein the calibration controller is configured to change the delay period monotonically for as long as the logic values output by the detection block all have the same value.

13. The electronic device of claim 11, wherein the calibration controller is configured to maintain the delay period unchanged when a logic value output by the detection block changes from a predetermined first value to a predetermined second value.

14. The electronic device of claim 1, wherein the electronic device is configured to provide the synchronization system with a succession of calibration trigger signals at the signal input, and wherein the calibration controller is configured to:
   increase the delay period when the next clock edge of the second clock signal after a logic transition of a delayed calibration trigger signal is a non-active edge;
   detect, from the output of the detection block, when, following a determination that the next edge of the second clock signal after a logic transition of a delayed calibration trigger signal was a non-active edge, the next edge of the second clock signal after a logic transition of the next delayed calibration trigger signal of the succession of calibration trigger signals is an active edge; and
   maintain the delay period when such a detection is made.

15. The electronic device of claim 1, wherein the electronic device is configured to provide the synchronization system with a succession of calibration trigger signals at the signal input, and wherein the calibration controller is configured to:

decrease the delay period when the next clock edge of the second clock signal after a logic transition of a delayed calibration trigger signal is an active edge;

detect, from the output of the detection block, when, following a determination that the next edge of the second clock signal after a logic transition of a delayed calibration trigger signal was an active edge, the next edge of the second clock signal after a logic transition of the next delayed calibration trigger signal of the succession of calibration trigger signals is a non-active edge; and maintain the delay period when such a detection is made.

16. The electronic device of claim 1, wherein the calibration controller is configured to:

set a value of a multi-bit calibration signal depending on the determination of whether, following the output from the delay block of a logic transition in the signal, the next clock edge received at the clock input is an active edge or is a non-active edge; and issue the calibration signal to the delay block.

17. The electronic device of claim 1, wherein the synchronization system has a calibration mode in which the electronic device is configured to provide the synchronization system with a succession of calibration trigger signals at the signal input, and in which the synchronization system is prevented from outputting the calibration trigger signals.

18. The electronic device of claim 17, wherein the synchronization system is configured or controlled to change from calibration mode to a transmission mode when the calibration controller detects a predetermined change in the output of the detection block, wherein, when in the transmission mode, the electronic device is configured to provide the synchronization system with signals at the signal input and the synchronization system is configured to allow the synchronization system to output the signals, delayed by the delay period.

19. The electronic device of claim 1, configured to send a succession of calibration trigger signals to the synchronization system at intervals when the electronic device is in a calibration mode.

20. The electronic device of any claim 1, wherein the synchronization system, when in a calibration mode, is configured to perform a minimum of two adjustments to the delay period before leaving the calibration mode.

\* \* \* \* \*